US005444194A

United States Patent [19]

Reinke

[11] Patent Number: 5,444,194

[45] Date of Patent: Aug. 22, 1995

[54] DECORATIVE SPEAKER ENCLOSURE

[75] Inventor: Raymond E. Reinke, Boise, Id.

[73] Assignee: Rayad of Boise, Inc., Boise, Id.

[21] Appl. No.: 289,914

[22] Filed: Aug. 12, 1994

[51] Int. Cl.[6] .......... H05K 5/00

[52] U.S. Cl. .......... 181/150; 181/153

[58] Field of Search .......... 181/150, 152, 153, 156, 181/199

[56] References Cited

U.S. PATENT DOCUMENTS

| | | | |
|---|---|---|---|
| D. 174,618 | 5/1955 | Fenton . | |
| 1,515,467 | 11/1924 | Draving . | |
| 1,804,306 | 5/1931 | Bender . | |
| 3,090,461 | 5/1963 | Cray | 181/199 |
| 3,170,538 | 2/1965 | Detrick | 181/150 |
| 3,384,719 | 5/1968 | Lanzara . | |
| 3,486,578 | 12/1969 | Albarino | 181/199 |
| 4,023,566 | 5/1977 | Martinmaas . | |
| 4,063,387 | 12/1977 | Mitchell . | |
| 4,754,852 | 7/1988 | Mule et al. . | |

*Primary Examiner*—Khanh Dang
*Attorney, Agent, or Firm*—Albert M. Crowder, Jr.

[57] ABSTRACT

A decorative vase or urn having a high fidelity audio speaker mounted within on a composite ring attached to the inside of the vase by a flexible adhesive to permit dampening of vibrations produced between the speaker and the rigid side of the vase. A plurality of openings are formed in the vase to permit distribution of the audio sound, the total area of the openings having a relation to the surface area of the speaker cone of 36% or greater.

9 Claims, 2 Drawing Sheets

DECORATIVE SPEAKER ENCLOSURE

BACKGROUND OF THE INVENTION

The present invention pertains generally to speaker enclosures for stereo or monaural music systems. More particularly, it pertains to a decorative vase having internal mounting provisions for either a mid-range frequency/woofer audio speaker and a high frequency/tweeter audio speaker or a sub-woofer/low frequency audio speaker mounted therein in accordance with volumetric efficiencies for optimization of sound readily disbursed through openings provided in the vase.

In the prior art, existing speakers have been mounted in ceilings, walls and rooms or within separate enclosure boxes. The enclosure boxes in particular are visible and immediately apparent as the source of the music to anyone present in the room. Moreover, speaker enclosure boxes generally do not blend with the decor of a room in which the music system is located. Various means around this deficiency have been attempted, generally, placing the speakers into walls or placing them in chairs and the like.

In particular, U.S. Pat. No. 4,063,387 issued to Mitchell describes such a system in which a speaker is positioned in a bottom opening in a ceramic pot forming the body of a hanging basket with a diffuser plate placed apart and below the speaker opening While effective to disguise the speaker and to a lesser degree disperse the sound radially, the '387 patent does not present the listener with the range of distortionless music embodied in modem high fidelity recordings and the like.

SUMMARY OF THE INVENTION

The primary object of the present invention is to provide an artistically designed vase or the like incorporating high compliance, mid-range/woofer and high range (tweeter) high fidelity speakers or low frequency (sub-woofer) high fidelity speakers wherein the speakers are mounted within the enclosure in such a manner as to reduce resonance which may be introduced at the juncture of the speaker and the rigid vase wall.

Another object of the invention is to provide such a speaker enclosure and speaker system having optimized the output characteristics of the speakers embodied in the vase and providing for optimized distribution of sound into the room in which the speaker is located.

The above objects are provided by the decorative speaker enclosure system of the present invention wherein high compliance speakers are mounted inside a decorative vase utilizing a composite frame of a medium-density fiber affixed to the interior of the vase with a hot glue seal which, when set, is flexible to provide dampening of the composite platform. Additionally, a high range/high compliance speaker may be mounted in a lid or in the upper body of the vase which is then sealed to the body of the vase using a flexible vibration-dampening epoxy. A center opening provides output of the high compliance speaker which is also mounted on a medium-density fiber ring affixed to the lid or upper body of the unit. Openings are provided around the lower extremity of the decorative vase having an opening area relative to the cone area of the mid-range/-woofer high compliance speaker.

BRIEF DESCRIPTION OF THE DRAWINGS

Other objects, features and advantages of the invention, its organization, construction and operation will be best understood from the following detailed description, taken in conjunction with the accompanying drawings, in which.

DETAILED DESCRIPTION OF THE PREFERRED EMBODIMENT

Figure 1:
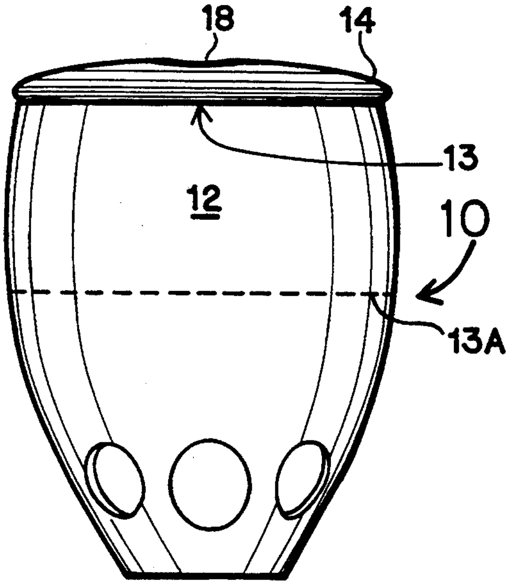
FIG. 1 is an elevation view of the decorative vase incorporating the high compliance speaker system of the present invention.

Referring now to FIG. 1 a speaker enclosure 10, in the form of a decorative vase, is constructed in accordance with the present invention as indicated. Enclosure 10 comprises a hollow, generally globe-shaped housing 12 made of fired pottery material and having a circular top opening 13 and a lid 14 of the same composition as the body 12. Lid 14 is designed to fit on body 12 and completely enclose the top opening 13. In an alternate embodiment, the opening, shown as dashed line 13A, may be positioned at any point along the body 12 between the opening 13 nd the midpoint of body 12, with the portion of body 12 above line 13A forming the top 14.

In this embodiment, as will be more fully explained hereafter, enclosure 10 includes a plurality of openings 16 formed in housing 12 proximate to the bottom of enclosure 10.

Figure 4:
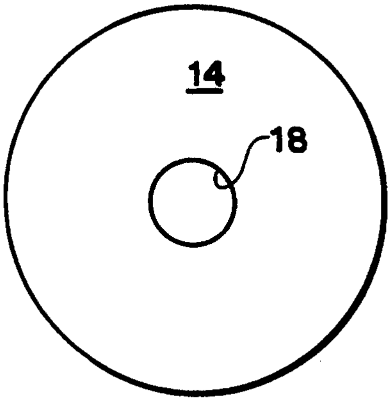
FIG. 4 is a top view of the lid of the decorative vase.
Figure 2:
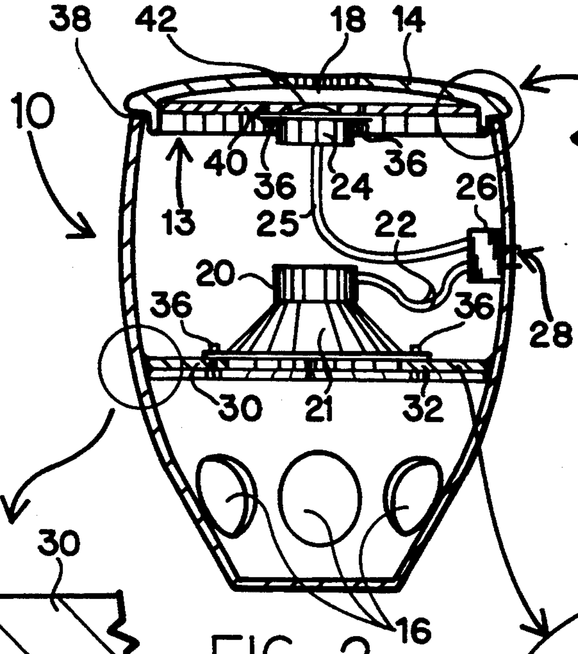
FIG. 2 is a cut-away view of the elevation of FIG. 1.
Figure 3B:
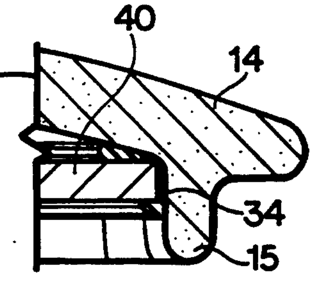
FIG. 3B is a detailed view of the section showing the affixation of the composite ring to the vase lid.

As shown in FIG. 1 and FIG. 4, lid 14 is circular and rises from the edge arcuately to the center of the lid 14. Referring also to FIG. 2 and FIG. 3B, a circular rim 15 is formed perpendicular to lid 14 proximate to the outer edge thereof and dimensioned to fit snugly within opening 13 of housing 12.

Figure 3A:
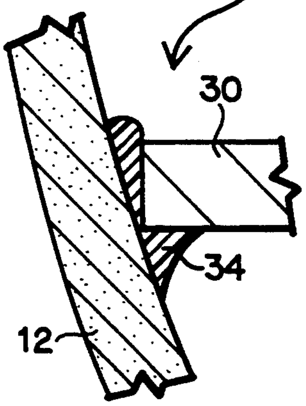
FIG. 3A is a detailed section of FIG. 2 showing the particulars of affixation of the composite ring to the ceramic vase.
Figure 3C:
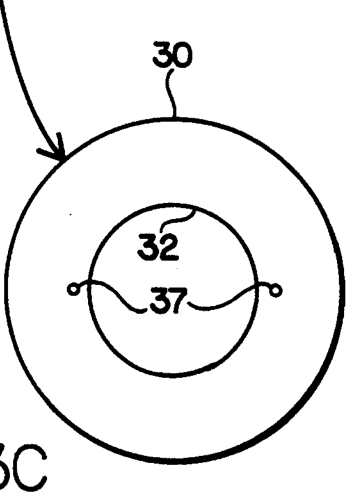
FIG. 3C is a top view of the composite ring used to affix the speaker to the interior of the decorative vase.

Still referring to FIG. 2 and FIG. 3B, in addition to FIG. 3A and 3C, a flat composite ring 30 formed from a medium-density fiber such as wood is positioned on the interior of housing 12 to a position where the outer circumference of ring 30 extends from side to side of the interior of housing 12. Ring 30 is affixed to the interior of housing 12 by a bead 34 of low temperature hot glue. The glue is selected from a group, including, by way of example, Chokes Unlimited #STC83, that is flexible upon hardening to provide a vibration dampening effect on ring 30. An audio speaker 20, such as an OREVOX #SW-820PPI, is mounted on ring 30 with bolts 36 positioned through holes 37 formed in ring 30. The speaker 20 is positioned central to ring 30 and covers the opening 32 in ring 30.

In a like manner, a second smaller ring 40 of a similar composition as ring 30 is positioned on the interior of lid 14 and is similarly mounted, again using hot glue 34 that dries to a flexible density. The composite ring 40 is glued on the interior of rim 15 and has an opening for mounting a second audio speaker 24, such as an OREVOX #TS2006, of the high frequency or tweeter type, positioning the opening 42 and the output of the speaker 24 adjacent to opening 18 in top 14. Speaker 24 is attached to composite ring 40 using bolts 36 in a like manner as with the attachment of speaker 20 to ring 30. Electrical feed cables 22 and 25 connect speakers 20 and 24 respectively to a cross-over network 26 glued to the inside of housing 20 with input leads to network 26 formed through the housing side as shown at 28.

With the rings 30 and 40 and the mounted speakers 20 and 24 affixed to the rings, the lid 14 is placed over the opening 13 of housing 12. Prior to positioning the lid 14, a bead of a silicone-based adhesive 38 is placed around the opening 13. The adhesive 38 is selected for its adhesive and vibration dampening characteristics. the adhesive 38 is selected from a group meeting ASTM Spec. C-834-7C such as DAP Alex Plus (acrylic latex plus silicone). This permits sealing of the lid 14 to body 12 forming an air-tight sealed chamber necessary for proper operation of the speakers 20 and 40.

In operation, sound produced through speaker 20 is directed downward and outwardly through sound dispersion holes 16 formed in housing 12 as above described. Speaker 20 generally generates upper low- to mid-range frequency sound vibrations. Similarly, speaker 24 emits sound waves through opening 18 in lid 14. The high-range or tweeter speaker 24 covers the ranges of sound above those produced by mid-range/-woofer speaker 20.

In order that the speaker 10 operate properly, that is, within the parameters required for the speaker 20 chosen the total area formed by holes 16 must be selected based on the speaker 20 utilized in the system 10. This is done by use of a formula based upon the area of the cone of the speaker 20 in relation to the area of the holes in the base of housing 12. Although hole 16 can be of any size or shape or number, the total area of the holes 16 must equal at least 36% of the surface area of the cone 21 of speaker 20 in order to permit the efficient operation of the speaker 20.

Figure 5:
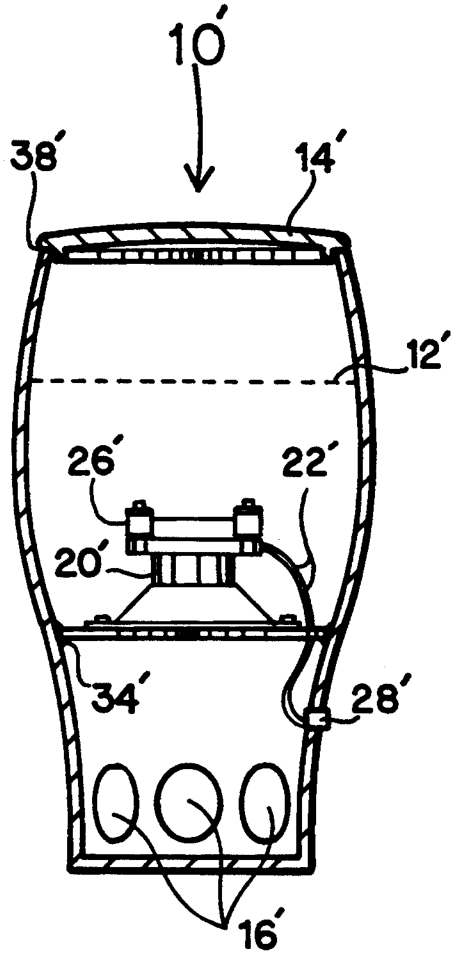
FIG. 5 is cut-away view of an alternate embodiment of the present invention embodying a low frequency of sub-woofer high compliance speaker.
Figure 6:
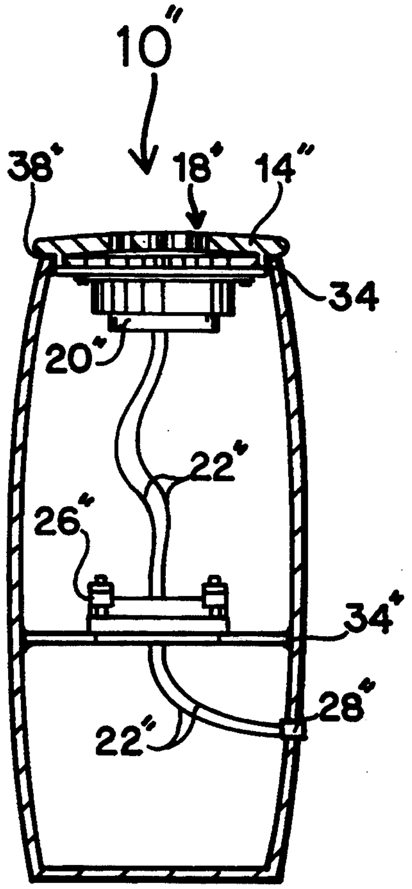
FIG. 6 is a cut-away view of an alternate embodiment of the speaker of FIG. 5.

Referring now to FIG. 5 and FIG. 6, alternate embodiments of the present invention incorporating only a single speaker 20' or 20" respectively, generally of the sub-woofer type, are depicted. In FIG. 5, as was shown in FIG. 2, the speaker 20' is directed downward to radiate sound through holes 16' formed in the housing 12'. In this embodiment, a solid lid 14' is affixed using epoxy 38, as before described, to affix the top 14' to body 12' and forming the sealed chamber necessary to operate the speaker 20'.

Additionally, a cross-over network 26' is positioned on and connected to speaker 20' with input leads 22' connecting the network 26' with an input jack 28' formed through vase body 12'.

Referring now to FIG. 6, a sub-woofer speaker 20" is affixed to the lid 14" as above described in affixing the tweeter 24 to the lid in the embodiment depicted in FIG. 2. In this embodiment, however, other than the opening formed in the lid to accommodate speaker 24", no other openings am formed in the housing 12".

In order that the system 10" operate properly, that is, within the parameters required for the speaker 20" chosen, the total area formed by hole 18" must be selected based on the speaker 20" utilized in the system 10'. This is done by use of a formula based upon the area of the cone of the speaker 20" in relation to the area of the hole 18" formed in lid 14". Although hole 18" can be of any size or shape, the total area of the hole 18" must be equal at least 36% of the surface area of the cone of speaker 20" in order to permit the efficient operation of the speaker 20".

As above described for FIG. 5, a cross-over network 26" is positioned on and connected to speaker 20" with input leads 22" connecting the network 26" with an input jack 28" formed through vase body 12".

Although particular embodiments of the invention have been described herein, it will be understood that the invention is not limited to the embodiments disclosed and that variations can be made therein without departing from the essential features of the invention and the preferred embodiments are not intended to elude the spirit or scope of the invention as set forth in the impending claims.

I claim:

1. A high compliance audio speaker apparatus comprising;

a hollow housing in the shape of a decorative vase having a generally circular body and a top and a bottom and having at least one opening of a area formed in the circular body thereof, said opening proximate the bottom of the housing;

a mounting ring of a composite medium density fiber mounted to the inside of the housing at a point between the opening and the top of the housing by the use of a flexible adhesive;

at least a first audio speaker having an output and a cone with a predetermined surface area mounted on the ring opposite the housing opening and with the speaker output directed through the opening in the ring toward the opening in the housing; and wherein the area of the opening in the housing is at least 36% of the area of the surface of the speaker cone.

2. The speaker arrangement of claim 1 wherein said audio speaker is connected through a cross-over network to an input from a drive source.

3. The speaker arrangement of claim 1, wherein said audio speaker is a mid-range/woofer audio speaker.

4. The speaker arrangement of claim 1, wherein said audio speaker is a sub-woofer audio speaker.

5. The speaker arrangement of claim 1 wherein said flexible adhesive is selected from a group of low temperature hot application glues.

6. The speaker arrangement of claim 1, wherein said housing includes an opening formed in the top thereof;

a lid predimensioned to fit on the top of said housing and cover in a snug fit said opening formed in the top of said housing;

said lid having an opening formed in the center thereof;

a second mounting ring of medium density fiber attached to the lid by a flexible adhesive such that when the lid is placed on the housing top the ring is on the interior of the housing;

a second audio speaker having an output mounted to said second ring and positioned to permit the second speaker output to be directed through the opening in the lid; and a silicon based adhesive placed at the point of contact between the lid and the housing top to seal the lid to the housing.

7. The speaker arrangement of claim 6, wherein said second speaker is connected through the cross-over network to the input.

8. The speaker arrangement of claim 6, wherein said second speaker is a high-range/tweeter audio speaker.

9. A high compliance audio speaker comprising;

a hollow housing having a generally circular body and a top and a bottom and having an opening formed in the top;

a lid predimensioned to fit on the opening of said housing and cover in a snug fit said opening in the top of said housing including a silicon based adhesive placed at the point of contact between the lid and the housing to seal the lid to the housing;

said lid having an opening formed in the center thereof;

a ring of medium density fiber attached to the lid by a flexible adhesive such that when the lid is placed on the housing the ring is on the interior of the housing;

an audio speaker having an output and a cone with a predetermined surface area mounted on the ring opposite the opening in the lid and with the speaker output directed through the opening in the ring toward the opening in the lid; and wherein the area of the opening in the lid is at least 36% of the area of the surface of the speaker cone.

* * * * *